US012761086B2

(12) United States Patent
Suzuki

(10) Patent No.: US 12,761,086 B2
(45) Date of Patent: Oct. 13, 2026

(54) POWER DEVICE TEMPERATURE ESTIMATION DEVICE FOR INVERTER

(71) Applicant: Mazda Motor Corporation, Aki-gun (JP)

(72) Inventor: Genri Suzuki, Aki-gun (JP)

( * ) Notice: Subject to any disclaimer, the term of this patent is extended or adjusted under 35 U.S.C. 154(b) by 358 days.

(21) Appl. No.: 18/664,551

(22) Filed: May 15, 2024

(65) Prior Publication Data

US 2024/0393183 A1 Nov. 28, 2024

(30) Foreign Application Priority Data

May 23, 2023 (JP) ................................ 2023-084574

(51) Int. Cl.

*G01K 7/01* (2006.01)
*H02M 1/32* (2007.01)
*H02M 7/00* (2006.01)
*H02M 7/5387* (2007.01)
*H05K 7/20* (2006.01)
*G01K 7/42* (2006.01)

(52) U.S. Cl.

CPC .............. *G01K 7/01* (2013.01); *H02M 1/327* (2021.05); *H02M 7/003* (2013.01); *H02M 7/53871* (2013.01); *H05K 7/209* (2013.01); *G01K 7/42* (2013.01); *G01K 2217/00* (2013.01)

(58) Field of Classification Search

CPC ... H05K 7/20218; H05K 7/209; H02M 1/327; H02M 7/53871; H02M 7/5387; H02M 7/003; H02P 29/024; H02P 29/68; G01K 7/01; G01K 7/42; G01K 2217/00

See application file for complete search history.

(56) References Cited

U.S. PATENT DOCUMENTS

2015/0346038 A1 12/2015 Osanai
2016/0065087 A1* 3/2016 Nagaoka ........... H03K 17/0828 324/139

FOREIGN PATENT DOCUMENTS

JP H07234162 A 9/1995
JP 2015228771 A 12/2015
JP 2016208770 A 12/2016

* cited by examiner

*Primary Examiner* — Randy W Gibson
(74) *Attorney, Agent, or Firm* — Alleman Hall LLP

(57) ABSTRACT

A device is attached to an inverter installed with a power device, and estimates a temperature of the power device on the basis of a temperature of a freewheel diode. The device includes a voltage divider section having a voltage divider circuit that includes a first element and a second element connected in series, a diode voltage detection section detecting a forward voltage of the freewheel diode on the basis of a divided voltage of the second element, a diode current detection section detecting a forward current of the freewheel diode, and a diode temperature estimation section estimating the temperature of the freewheel diode on the basis of the detected forward voltage, the detected forward current, and characteristic data. The first element is a diode arranged in forward parallel with the freewheel diode, and the second element is a resistor.

18 Claims, 9 Drawing Sheets

$$Vrf = Vf\_1 - Vfp$$
$$= Vfd + \Delta Vf - Vfp$$

$$Vad = Tvf \cdot Vrf$$

POWER DEVICE TEMPERATURE ESTIMATION DEVICE FOR INVERTER

TECHNICAL FIELD

The disclosed technique relates to a device that estimates a temperature of a power device provided in an inverter.

BACKGROUND ART

In recent years, electrification of automobiles has been advanced significantly. In conjunction with this trend, there is a tendency of increasing output of a drive motor mounted on the automobile and output of an inverter controlling the drive motor. When the output of the inverter is increased, a temperature of a power device including a switching element becomes high. In order to prevent thermal damage of the inverter caused by the above, it has been requested to detect a temperature of the switching element with a high degree of accuracy.

For this purpose, it has been commonly practiced to attach a temperature sensor to a board on which the power device is installed, and detect the temperature of the switching element. However, in this case, since the temperature sensor is remotely located from the power device, there are problems of a lack of responsiveness to detection and a significant detection error.

Meanwhile, the following method has been proposed (for example, in JP2016-208770A). In the method, a temperature of a freewheel diode, which is connected in anti-parallel with the switching element, is detected, and such a temperature is taken as the temperature of the switching element.

In detail, a forward voltage at the time of a forward current of the freewheel diode being 1 A is detected by using a resistive voltage divider circuit including two resistors. Then, the temperature of the freewheel diode is determined on the basis of a relationship between the detected value, a current-voltage characteristic of the freewheel diode, and the temperature of the freewheel diode.

SUMMARY OF THE INVENTION

Problem to be Solved by the Invention

In the method disclosed in JP2016-208770A, a detection signal of the divided voltage value is output to a control section. Then, the control section determines the temperature of the freewheel diode. In general, the voltage tolerated by the control section is only a few volts. Thus, when the switching element, to which a high voltage of several hundred volts is applied, as in an in-vehicle inverter is the target, the voltage has to be divided at a level of 1/100.

In this case, in the resistive voltage divider circuit described above, a fluctuation component by the temperature in the forward voltage of the freewheel diode as the detection target is also divided at the level of 1/100. As a result, it is required to detect a minute voltage change (for example, at a level of 100 μV), which makes it difficult to estimate the temperature with a high degree of accuracy.

To handle the above problem, the disclosed technique provides a device capable of estimating a temperature of a switching element, even in an inverter using a high voltage, with a high degree of accuracy.

Means for Solving the Problem

The disclosed technique relates to a power device temperature estimation device that is attached to an inverter and is configured to estimate a temperature of a power device using a temperature of a freewheel diode, the inverter being installed with the power device including a switching element and the freewheel diode connected in anti-parallel with the switching element.

The power device temperature estimation device includes a voltage divider section having a voltage divider circuit that includes a first element and a second element connected in series with each other and is connected in parallel with the freewheel diode, a diode voltage detection section that is connected in parallel with the second element to detect a forward voltage of the freewheel diode on the basis of a divided voltage of the second element, a diode current detection section that is configured to detect a forward current of the freewheel diode, and a diode temperature estimation section that has characteristic data on a voltage, a current, and a temperature of the freewheel diode and is configured to estimate the temperature of the freewheel diode on the basis of the detected forward voltage, the detected forward current, and the characteristic data. The first element is a diode arranged in forward parallel with the freewheel diode, and the second element is a resistor.

That is, similarly to JP2016-208770A, this power device temperature estimation device estimates the temperature of the switching element or the power device on the basis of the forward voltage of the freewheel diode. In the technique disclosed in JP2016-208770A, the forward voltage of the freewheel diode is detected using the resistive voltage divider circuit including the two resistors. Meanwhile, in this power device temperature estimation device, the forward voltage of the freewheel diode is detected using the voltage divider circuit including the diode and the resistor.

In a manner of speaking, the resistor has a configuration equivalent to the resistor being connected in parallel with the diode that is applied with the reduced forward voltage from the forward voltage of the freewheel diode by the forward voltage of the diode. In other words, according to the voltage divider circuit with this configuration, a fluctuation amount itself of the forward voltage, which is associated with a temperature change, can be detected without being divided. As a result, there is no need to detect a minute voltage change, which facilitates estimation of the temperature and increases estimation accuracy thereof.

The diode voltage detection section may have a transformer section that increases the divided voltage of the second element.

In this way, an output side of the diode voltage detection section can be independent of (insulated from) a circuit in a high-voltage power system of several hundred volts. Even when electric power in the voltage divider section becomes abnormal, such abnormal electric power does not directly affect the diode voltage detection section.

The diode voltage detection section may have a protection diode that is connected in parallel with the second element.

The forward voltage of the freewheel diode is high. Thus, when the diode (first element) in the voltage divider circuit fails and is short-circuited, the high voltage thereof is applied to the resistor (second element). In such a case, the temperature estimation device is possibly damaged. Meanwhile, with the protection diode, the current can flow from a positive electrode side to a negative electrode side through the protection diode. Thus, it is possible to prevent application of the abnormally high voltage. Consequently, it is possible to prevent the abnormally large current from flowing into the transformer section.

The inverter may be further installed with a board on which the power device is installed and a heat dissipator attached to the board. The first element may separately be arranged from the board or may be arranged on the board in a contact state with the heat dissipator, and a temperature of the first element may thereby be maintained within an allowable range for detection of the forward voltage.

In this way, influence of the temperature change of the diode that constitutes the first element can be ignored. Thus, calculation of voltage dividing can be simplified.

The diode temperature estimation section may further have a dynamic thermal model to calculate the temperature of the power device. The diode temperature estimation section may further calculate an error between an estimated element temperature, which is the temperature of the power device estimated by the diode temperature estimation section, and a calculated element temperature, which is the temperature of the power device calculated using the dynamic thermal model, calculate a Kalman gain, modify the dynamic thermal model by introducing the error and the Kalman gain, and adopt a calculated value using the modified dynamic thermal model as the temperature of the power device.

The temperature of the power device (the estimated element temperature) that is estimated by the diode temperature estimation section includes switching noise. Meanwhile, since the dynamic thermal model is not affected by switching, the calculated element temperature does not include the switching noise. Accordingly, by using a known Kalman filter method, the dynamic thermal model is modified by the error between the estimated element temperature and calculated element temperature and the Kalman gain. Then, the calculated value by the modified dynamic thermal model is adopted as the temperature of the power device.

As a result, the dynamic thermal model is successively modified, and the calculated element temperature converges to a true value. Thus, the diode temperature estimation section can estimate the temperature of the power device with the reduced switching noise. As a result, estimation accuracy of the temperature of the power device is improved.

The diode temperature estimation section further may have a dynamic thermal model to calculate the temperature of the power device; and gain setting data on a specific output associated with noise of the inverter and a gain corresponding to the dynamic thermal model. The diode temperature estimation section may further calculate an error between an estimated element temperature, which is the temperature of the power device estimated by the diode temperature estimation section, and a calculated element temperature, which is the temperature of the power device calculated by the dynamic thermal model, acquire the gain from the gain setting data, modify the dynamic thermal model by introducing the error and the gain, and adopt a calculated value using the modified dynamic thermal model as the temperature of the power device.

The calculation of the Kalman gain requires a large calculation load. This may cause a delay in responsiveness and an increase in size of hardware. Meanwhile, when it is configured to predict a change in the switching noise in advance and thereby change the gain (so-called feed-forward control), the calculation of the Kalman gain becomes unnecessary. Thus, it is possible to ensure the high responsiveness by reducing the calculation load while improving the estimation accuracy of the temperature of the power device.

The specific output may be a current value that is output from the inverter, and may be set in the gain setting data such that the gain is reduced as the current value is increased. Alternatively, the specific output may be a carrier frequency of the inverter, and may be set in the gain setting data such that the gain is reduced as the carrier frequency is reduced.

That is, the switching noise is increased as the current output from the inverter is increased. The switching noise is reduced as the current output from the inverter is reduced. In addition, the switching noise is increased as the carrier frequency of the inverter is reduced. The switching noise is reduced as the carrier frequency of the inverter is increased. That is, the current value output from the inverter and the carrier frequency of the inverter are each correlated with the change in the switching noise.

Thus, when the gain is increased or reduced according to any of these changes, the appropriate gain can be acquired predictably.

The forward voltage of the freewheel diode may be detected in an off period of the switching element, and may be detected regardless of duration of the period.

The influence of the noise can be suppressed by introducing the dynamic thermal model. Thus, the forward voltage can be detected regardless of the duration of the off period. As a result, detection timing of the forward voltage is no longer limited. Thus, the temperature of the power device can be estimated appropriately.

A value that is acquired by averaging a plurality of values of the forward voltage may be used to estimate the temperature of the freewheel diode, the plurality of values being detected within a predetermined electrical angle range, which is set in advance.

In this way, the stable forward voltage can be acquired, and the temperature estimation accuracy is improved. In addition, the number of the forward voltages that can be detected at a predetermined electrical angle depends on the carrier frequency. Thus, the number of the detectable forward voltages is increased as the carrier frequency is increased. As described above, the switching noise is reduced as the carrier frequency is increased. Thus, the further stable forward voltage can be acquired.

Advantage of the Invention

According to the disclosed technique, the temperature of the switching element can be estimated with a high degree of accuracy even in the inverter using the high voltage. Thus, the thermal damage of the inverter can effectively be prevented.

MODES FOR CARRYING OUT THE INVENTION

A description will hereinafter be made on the disclosed technique. However, the following description is essentially and merely illustrative.

Application Example of Disclosed Technique

Figure 1:
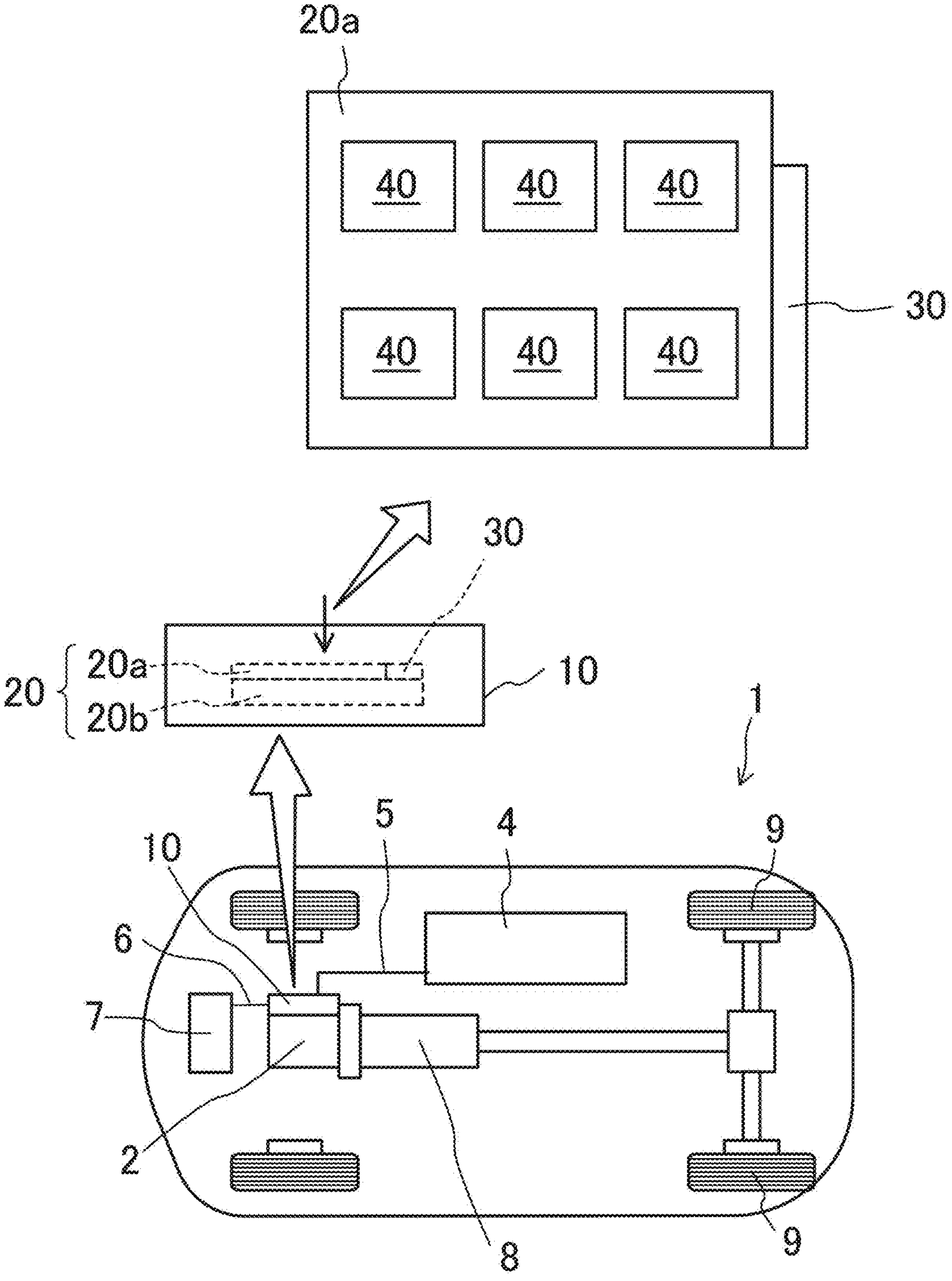
FIG. 1 is a schematic view illustrating an electric vehicle, to which the disclosed technique is applied.

FIG. 1 illustrates a preferred application example (an electric vehicle 1) of the disclosed technique. On the electric vehicle 1, a drive motor 2 is mounted as a drive source thereof. The drive motor 2 is a permanent magnet synchronous motor and is electrically connected to an inverter 10. The inverter 10 is connected to a drive battery 4 via a high-voltage wire 5. The inverter 10 is also connected to a controller 7 via a low-voltage wire 6 for control.

The drive battery 4 includes a plurality of lithium-ion batteries. A rated voltage of the drive battery 4 is 300 V or higher, for example. The drive battery 4 supplies high-voltage direct current (DC) power to the inverter 10. The inverter 10 is subjected to pulse-width modulation (PWM) control by the controller 7, the DC power thereof is converted to three-phase alternating current (AC), and the three-phase AC is supplied to the drive motor 2. The drive motor 2 thereby rotates.

A transmission 8 is coupled to a rear portion of the drive motor 2. A speed of rotary power that is output from the drive motor 2 is changed by the transmission 8, and thereafter the changed rotary power is transmitted to drive wheels 9 via a propeller shaft, a differential gear, and a pair of drive shafts. In this way, the electric vehicle 1 travels.

Figure 2:
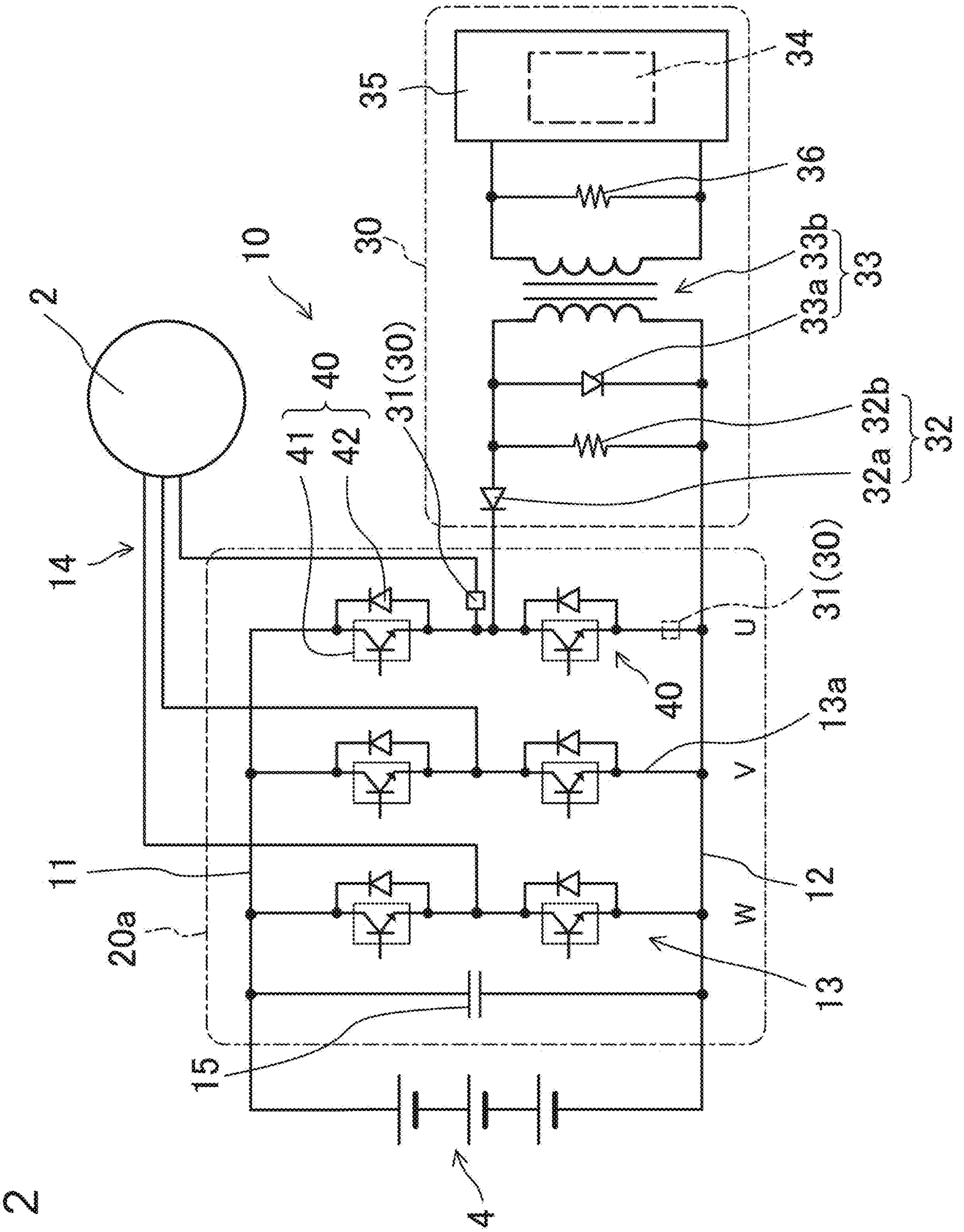
FIG. 2 is a schematic view illustrating a configuration of a power device temperature estimation device.

As illustrated in a simplified manner in FIG. 1, a power module 20 including a board 20*a* and a heat dissipator 20*b* is installed in the inverter 10. A power device temperature estimation device 30 is further assembled to the power module 20 (this will be described below). Six power devices 40 are installed on a surface of the board 20*a*. As illustrated in FIG. 2, each of these power devices 40 includes a switching element 41 and a freewheel diode 42 connected in anti-parallel with this switching element 41.

The board 20*a* is provided with a known inverter circuit. The inverter circuit converts the DC power from the drive battery 4 to three-phase (U-phase, V-phase, and W-phase) AC power, and outputs the three-phase AC power to the drive motor 2, which rotates with the three-phase AC. The inverter circuit is provided with a positive electrode side wire 11 connected to a positive electrode side of the drive battery 4 and a negative electrode side wire 12 connected to a negative electrode side of the drive battery 4. Then, three circuits (half-bridge circuits 13) corresponding to the respective phases are connected in parallel between the positive electrode side wire 11 and the negative electrode side wire 12.

The two power devices 40, 40 are connected in series to each of the half-bridge circuits 13, 13, 13. In addition, an output wire 14 for outputting the AC power to the drive motor 2 is connected between the two power devices 40, 40. At a position between the positive electrode side wire 11 and the negative electrode side wire 12 on an input side from the half-bridge circuits 13, 13, 13, a smoothing capacitor 15 is connected in parallel with the half-bridge circuits 13, 13, 13.

When the inverter 10 is actuated, each of the switching elements 41 is turned on/off at a high speed by the PWM control. This generates a current having a pseudo alternating waveform, and the current flows into the drive motor 2 via the output wire 14 in any of the phases. In addition, the current flows from the drive motor 2 to the negative electrode side wire 12 via the output wires 14 of the other phases.

The freewheel diode 42 is provided to prevent damage to the switching element 41, which is caused by an instantaneous back electromotive force generated at the time when the respective switching element 41 is turned off. Thus, when the respective switching element 41 is turned off, a forward voltage is applied to and a forward current flows through the freewheel diode 42.

The switching element 41, which is turned on/off at the high speed and intermittently interrupts a large current, generates heat. Accordingly, in order to cool the power device 40, as illustrated in FIG. 1, the heat dissipator 20*b* is attached to a back surface of the board 20*a*. The heat dissipator 20*b* is configured to be cooled by a refrigerant that is circulated and supplied from a cooling system (not illustrated).

The switching element 41 is possibly damaged when the temperature thereof exceeds an upper limit temperature. For this reason, the temperature of the switching element 41 is detected, and control of the inverter 10 is thereby limited. However, since a heat generation amount of the switching element 41 is changed significantly according to a frequency of on/off, and the switching element 41 is always cooled while being actuated, the temperature of the switching element 41 is changed significantly in a short time. For this reason, high responsiveness is required to appropriately manage the temperature of the switching element 41 by detecting the temperature thereof with a high degree of accuracy.

The power device 40 exemplified herein is a metal-oxide-semiconductor field-effect transistor (MOSFET) or a reverse conducting insulated-gate bipolar transistor (RC-IGBT) in which the switching element 41 and the freewheel diode 42 are integrated. Thus, a temperature of the freewheel diode 42 can be taken as the temperature of the switching element 41.

There is a type of the power device 40 in which the switching element 41 and the freewheel diode 42 are configured as separate components. Also, in this case, the switching element 41 and the freewheel diode 42, which constitute the same power device 40, are arranged on the board 20*a* in close proximity to each other. Thus, also, in this case, the temperature of the freewheel diode 42 can be taken as the temperature of the switching element 41.

In other words, the temperature of the freewheel diode 42 can be taken as the temperature of the switching element 41, which constitutes the same power device 40. It can be said that the temperatures of the freewheel diode 42 and the switching element 41 correspond to a temperature of the power device 40. For this reason, the power device temperature estimation device 30 is attached to this inverter 10, and is devised to enable estimation of the temperature of the power device 40 with the high responsiveness and the high degree of accuracy on the basis of the forward voltage applied to the freewheel diode 42.

<Power Device Temperature Estimation Device>

As illustrated in FIG. 1, in the power module 20, the power device temperature estimation device 30 (also simply referred to as the "temperature estimation device 30") in this embodiment is provided in the form of being independent of the board 20*a*. More specifically, the temperature estimation device 30 is attached to the heat dissipator 20*b* while being externally attached to the board 20*a*. However, the temperature estimation device 30 may be partially integrated into the board 20*a* and thereby integrated with the board 20*a*.

As illustrated in FIG. 2, the temperature estimation device 30 includes a diode current detection section 31, a voltage divider section 32, a diode voltage detection section 33, an AD converter 35, and the like. The voltage divider section 32 includes a voltage divider diode 32*a* (a first element), a voltage divider resistor 32*b* (a second element), and the like. The diode voltage detection section 33 includes a protection diode 33*a*, a transformer section 33*b*, and the like. It will be appreciated that the various sections described herein may be sections of circuitry and/or sensors as appropriate.

This temperature estimation device 30 sets the single power device 40 as an estimation target. More specifically, the power device 40 that is arranged in a lower arm 13*a* of the U-phase is set as the estimation target. In this case, when there is a difference in temperature among the power devices 40 due to a structure of the power module 20, the power device 40, the temperature of which is the highest, is preferably set as the estimation target.

Alternatively, the voltage divider section 32 and the like may be provided for each of the U, V, and W-phases or each of the power devices 40, and the plurality of power devices 40 may be set as the estimation targets. In this case, although the structure becomes complicated, thermal damage of the inverter 10 can be prevented with a higher degree of accuracy.

(Diode Current Detection Section 31)

The diode current detection section 31 is provided in a manner to correspond to the power device 40 as the estimation target, and detects the forward current flowing through the freewheel diode 42 therein. Any diode current detection section 31 that can measure a current value may be employed, such as a current detector, a current sensor, or the like.

For example, as illustrated in FIG. 2, the diode current detection section 31 is installed at a predetermined position in the wire on an upstream side or a downstream side of the power device 40 as the estimation target. Then, the diode current detection section 31 detects the current (the forward current) flowing through the freewheel diode 42 in an off period of the switching element 41.

(Voltage Divider Section 32)

The voltage divider section 32 has a function to divide the high forward voltage of the freewheel diode 42 into two at a predetermined ratio. While being connected in series with each other, the voltage divider diode 32*a* (the first element) and the voltage divider resistor 32*b* (the second element) are connected in parallel with the freewheel diode 42 as the estimation target. The voltage divider diode 32*a* is arranged in forward parallel that is the same direction as the freewheel diode 42. In other words, the voltage divider diode 32*a* is arranged in a direction of being anti-parallel to the switching element 41.

When compared using the same forward current, the voltage divider diode 32*a*, which is applied with the slightly lower forward voltage than that applied to the freewheel diode 42, is used. A size of the voltage divider resistor 32*b* is selected according to a magnitude of the forward voltage applied to the voltage divider diode 32*a*.

The voltage divider diode 32*a* and the voltage divider resistor 32*b* constitute a voltage divider circuit, and the forward voltage of the freewheel diode 42 is detected using this voltage divider circuit. That is, the diode voltage detection section 33 is connected in parallel with the voltage divider resistor 32*b*, and detects the forward voltage of the freewheel diode 42 on the basis of the divided voltage of the voltage divider resistor 32*b*.

In a conventional voltage divider circuit, the resistor is also used for the first element (a resistive voltage divider circuit). However, in such a case, when a high voltage of several hundred volts or the like is applied to the switching element 41 as the target, the voltage has to be divided at a level of 1/100. Consequently, as described above, a fluctuation component associated with a temperature change in the forward voltage of the freewheel diode 42 as a detection target is also divided at the level of 1/100. As a result, it is required to detect a minute voltage change (for example, at a level of 100 μV), which makes it difficult to estimate the temperature with the high degree of accuracy.

Meanwhile, in this voltage divider section 32, the voltage divider diode 32*a* is the first element. In a manner of speaking, the voltage divider resistor 32*b* has a configuration equivalent to that the voltage divider resistor 32*b* is connected in parallel with a diode that is applied with the reduced forward voltage from the forward voltage of the freewheel diode 42 by the forward voltage of the voltage divider diode 32*a*.

Figure 3:
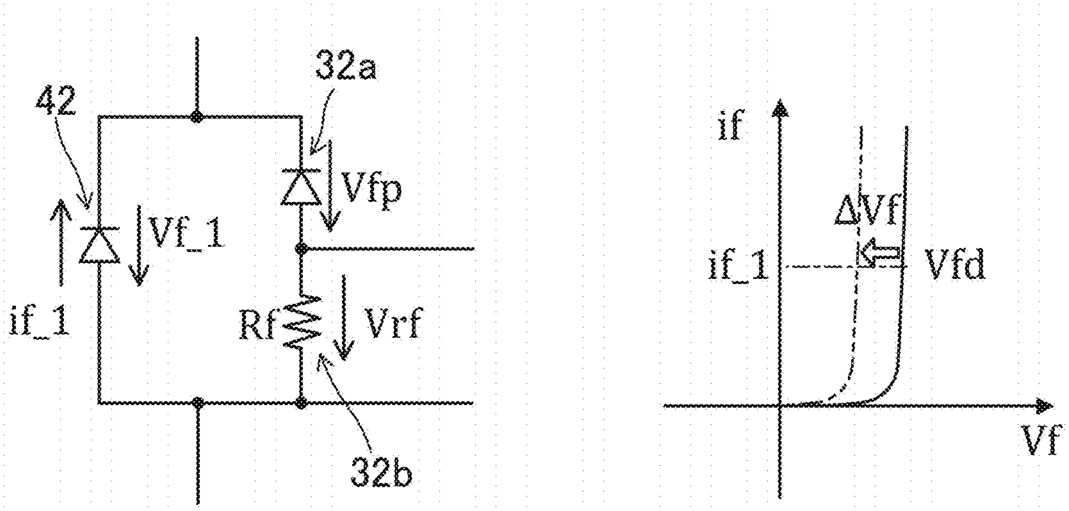
FIG. 3 is a schematic view illustrating detection of a forward voltage of a freewheel diode.
Figure 3:
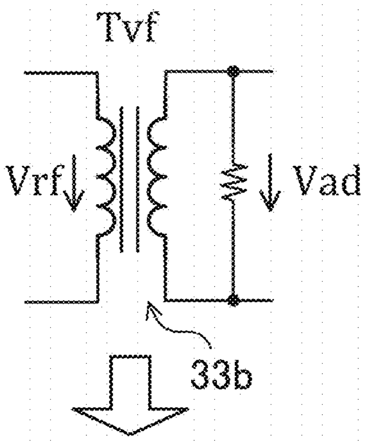

A circuit configuration of the voltage divider section 32 is illustrated in a simplified manner at an upper left corner of FIG. 3. A graph indicating a relationship between a forward voltage Vf and a forward current if of the diode is illustrated at an upper right corner of FIG. 3. A solid line represents a forward voltage Vfd of the freewheel diode 42. A fluctuation amount of the forward voltage Vfd of the freewheel diode 42 is relatively small even when the forward current if is increased.

When the temperature of the freewheel diode 42 is increased, the forward voltage Vfd thereof is shifted in a reduction direction according to an increase amount of the temperature as indicated by an imaginary line, and is reduced (ΔVf).

Unlike the resistor, a voltage fluctuation amount ΔVf of the diode with respect to the temperature is almost the same and small even when a magnitude of the forward current differs. For example, in a case of the power device 40, the fluctuation amount ΔVf of the forward voltage Vf that is associated with the temperature increase is about −0.1 V even when the forward current thereof is changed to be increased or reduced.

As illustrated in FIG. 3, a case where a forward current if_1 flows through the freewheel diode 42 and a forward voltage Vf_1 is applied thereto is assumed. The corresponding switching element 41 is turned off and thus can be ignored. In such a case, a divided voltage Vrf of the voltage divider resistor 32*b* is Vf_1−Vfp as expressed by an equation in FIG. 3. When the temperature change is reflected thereto, Vfd+ΔVf−Vfp.

In other words, according to the voltage divider circuit with this configuration, the fluctuation amount ΔVf itself of the forward voltage Vf, which is associated with the temperature change, can be detected without being divided. As a result, there is no need to detect the minute voltage change, which facilitates the estimation of the temperature and increases estimation accuracy thereof.

By the way, in the case where the voltage divider diode 32*a* is a resistive voltage divider circuit that includes a resistor with a resistance value R0, a fluctuation component by the temperature is (Rf/R0+Rf)·ΔVf. This pressure, which is reduced as a result of voltage dividing, has to be detected.

Here, the voltage divider diode 32*a* is separately arranged from the board 20*a* and is configured that influence of the temperature change of the board 20*a* on the forward voltage of the voltage divider diode 32*a* can substantially be ignored (can be regarded that Vfp is substantially constant).

That is, even when a temperature of the voltage divider diode 32*a* is changed, the temperature is held within an allowable range for the detection of the forward voltage Vf_1 of the freewheel diode 42. In the case where the voltage divider diode 32*a* is arranged on the board 20*a*, it may be configured to arrange the voltage divider diode 32*a* in a contact state with the heat dissipator 20*b* such that the temperature thereof can be held within the above-described allowable range by heat radiation to the heat dissipator 20*b*.

In this way, influence of the temperature change of the voltage divider diode 32*a* can be ignored. Thus, the calculation of voltage dividing can be simplified.

The forward voltage Vfp of the voltage divider diode 32*a* may be detected in consideration of the temperature change thereof. That is, a temperature sensor is installed in the voltage divider diode 32*a* and thereby actually measures the temperature of the voltage divider diodes 32*a*. Data on the temperature and a current-voltage characteristic (characteristic data) of the voltage divider diode 32*a* is stored in advance in a diode temperature estimation section 34. Then, based on the actually measured temperature of the voltage divider diode 32*a* and the characteristic data thereof, the forward voltage Vf of the voltage divider diode 32*a*, for which the temperature change is taken into consideration, is detected.

(Diode Voltage Detection Section 33)

As described above, the diode voltage detection section 33 includes the protection diode 33*a*, the transformer section 33*b*, and the like. The diode voltage detection section 33 has a function to output the divided voltage of the voltage divider resistor 32*b* as an analog signal of a predetermined magnitude in an insulated state from the circuit of the inverter 10.

In a state of being arranged oppositely from the freewheel diode 42 and the voltage divider diode 32*a*, the protection diode 33*a* is connected in parallel with the voltage divider resistor 32*b*. The forward voltage of the freewheel diode 42 is high. Thus, when the voltage divider diode 32*a* fails and is short-circuited, the high voltage is applied to the voltage divider resistor 32*b*. In such a case, the temperature estimation device 30 is possibly damaged.

To handle such a problem, the protection diode 33*a* as described above is provided. In this way, even when the voltage divider diode 32*a* is short-circuited, the current can flow from the positive electrode side to the negative electrode side through the protection diode 33*a*. Thus, it is possible to prevent application of the abnormally high voltage to the voltage divider resistor 32*b*. Consequently, it is possible to prevent the abnormally large current from flowing into the transformer section 33*b*. Therefore, the temperature estimation device 30 can be protected.

The AD converter 35 is connected to the voltage divider section 32 via the transformer section 33*b*. The AD converter 35 converts the analog signal of the voltage or the current, which is input from the transformer section 33*b*, to a digital signal. A load resistor 36 is connected in parallel between the AD converter 35 and the transformer section 33*b*.

The transformer section 33*b* includes a known pulse transformer that is connected in parallel with the voltage divider resistor 32*b*, and the AD converter 35 is separated from the voltage divider section 32 by the transformer section 33*b*. In this way, the AD converter 35 can be independent of (insulated from) a circuit in a high-voltage power system of several hundred volts. Even when electric power in the voltage divider section 32 becomes abnormal, such abnormal electric power does not directly affect the AD converter 35.

In addition, the protection diode 33*a* prevents the large current from flowing into the transformer section 33*b*. For this reason, the transformer section 33*b* does not have to be prepared for the large current, and thus can be downsized. Furthermore, only the relatively small current, which corresponds to the divided voltage of the voltage divider resistor 32*b*, flows through the transformer section 33*b*. Thus, the transformer section 33*b* can increase the voltage to the appropriate voltage for the AD converter 35 with a relatively small turn number ratio.

More specifically, in general, a tolerable voltage by the AD Converter 35 is about ±5 V. Accordingly, a secondary-side voltage Vad of the transformer section 33*b* has to fall within such a range. Meanwhile, as indicated by the drawing and an equation in a lower portion of FIG. 3, the transformer section 33*b* converts a primary-side voltage (that is, the divided voltage Vrf of the voltage divider resistor 32*b*) according to a ratio between a primary-side turn number (T1) of the transformer section 33*b* connected in parallel with the voltage divider resistor 32*b* and a secondary-side turn number (T2) of the transformer section 33*b* connected to the AD converter 35 (a turn number ratio Tvf: T2/T1). Then, the transformer section 33*b* outputs the converted primary-side voltage to the secondary side (Vad=Tvf·Vrf).

Since the current flowing through the primary side of the transformer section 33*b* is relatively small, by setting the turn number ratio Tvf to be increased by several times (for example, four times), the primary-side voltage can be increased and output to the secondary side. In this way, the secondary-side voltage of transformer section 33*b* can fall within the range of about ±5 V. As a result, the divided voltage Vrf of the voltage divider resistor 32*b* and thus the forward voltage Vf of the freewheel diode 42 can stably be detected with the high degree of accuracy.

(Diode Temperature Estimation Section 34)

The diode temperature estimation section 34 includes an integrated circuit (IC) chip and the like placed on a board of the AD converter 35. In other words, the diode temperature estimation section 34 is provided as a functional structure in the AD converter 35.

More specifically, the diode temperature estimation section 34 includes known hardware such as a processor and memory provided in the AD converter 35, and software such as a program installed in the memory and data. The diode temperature estimation section 34 cooperates with these types of hardware and software to estimate the temperature of the freewheel diode 42 by using the detected forward current if and forward voltage Vf.

In other words, the diode temperature estimation section 34 has characteristic data on the current, the voltage, and the temperature of the freewheel diode 42. More specifically, as indicated by a solid line L1 in an upper graph of FIG. 4, the diode temperature estimation section 34 has voltage-temperature characteristic data that specifies a relationship between the forward voltage Vf of the freewheel diode 42 with respect to the forward current if as a reference and a temperature td thereof.

Although the relationship between the forward voltage Vf of the freewheel diode 42 and the temperature td thereof is relatively small, this relationship is changed according to a magnitude of the forward current if (see the upper right graph in FIG. 3).

Figure 4:
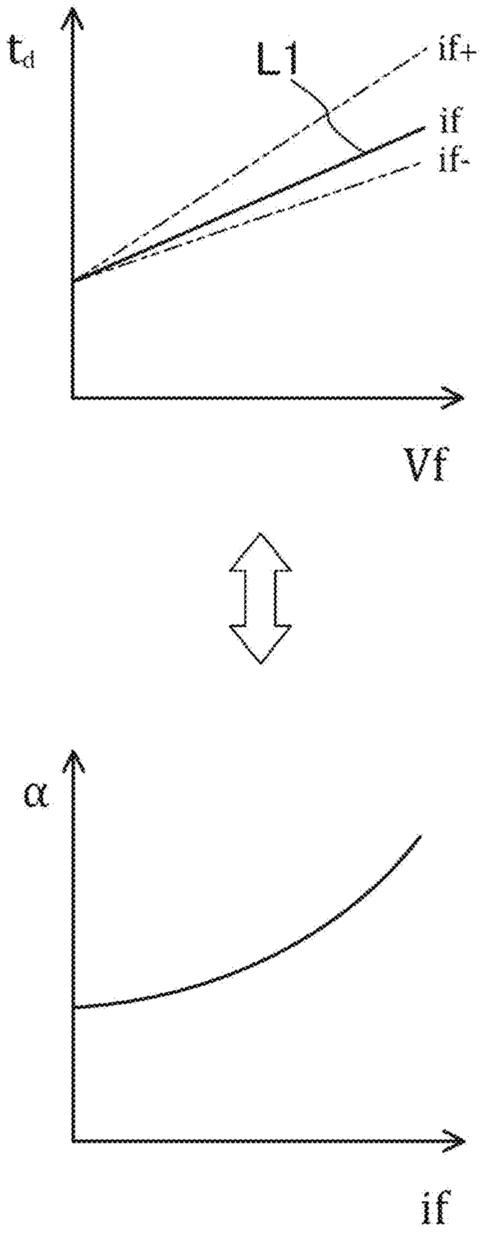
FIG. 4 includes graphs schematically illustrating voltage-temperature characteristic data and current correction data.

For example, as indicated by a virtual line in the upper graph of FIG. 4, when the forward current if is increased (if+), the temperature td with respect to the forward voltage Vf is increased accordingly. When the forward current if is reduced (if−), the temperature td with respect to the forward voltage Vf is reduced accordingly. A magnitude of the change in the temperature td with respect to the forward voltage Vf, which is associated with a change in the forward current if, is increased with the increase in the forward current if.

For this reason, the diode temperature estimation section 34 further has current correction data that is set on the basis of the above relationship and specifies a relationship between the forward current if and a correction coefficient α of the above-described voltage-temperature characteristic data, as indicated by a lower graph in FIG. 4.

The voltage-temperature characteristic data and the current correction data are stored in the memory of the AD converter 35. The format of the characteristic data can be selected according to the specifications. Instead of the current correction data, voltage-temperature characteristic data for each current value may be used.

The diode temperature estimation section 34 estimates the temperature td of the freewheel diode 42 on the basis of the forward current if of the freewheel diode 42 detected by the diode current detection section 31, the forward voltage Vf detected by the diode voltage detection section 33, and the characteristic data thereof.

More specifically, the correction value a is identified from the detected forward current if and the current correction data, and the voltage-temperature characteristic data is corrected to data that corresponds to the forward current if by using the correction value a. Then, the temperature td of the freewheel diode 42 is identified from the detected forward voltage Vf and the corrected voltage-temperature characteristic data. As described above, the temperature td of the freewheel diode 42 corresponds to the temperature of the switching element 41 and also corresponds to the temperature of the power device 40.

<Countermeasure Against Noise>

The forward current if and the forward voltage Vf described above are detected in a period in which the switching element 41 of the power device 40 as the estimation target is off (the off period). However, the switching element 41 is turned on/off at the high speed, and a length of the off period is changed. Thus, the detection of the forward current if and the forward voltage Vf is easily affected by noise that is generated by switching (switching noise).

For example, the detection of the forward current if and the forward voltage Vf is more significantly affected by the switching noise as the off period is shortened. Accordingly, the influence of the switching noise can be reduced when the forward current if and the forward voltage Vf are detected in the long off period. However, extending the off period possibly hinders appropriate driving of the drive motor 2. In addition, when the detection of the forward current if and the forward voltage Vf is limited in the long off period, the temperature of the power device 40 cannot be estimated appropriately.

Meanwhile, the large switching noise is superimposed on the forward current if and the forward voltage Vf that are detected in the short off period. As a result, the estimation accuracy of the temperature of the power device 40 is reduced. In other words, since the temperature of the power device 40 that is estimated by the diode temperature estimation section 34 (an estimated element temperature) includes the switching noise, in order to estimate the temperature of the power device 40 with the high degree of accuracy, it is preferred to reduce the influence of the switching noise.

Accordingly, in this temperature estimation device 30, the estimation of the temperature of the power device 40, which is based on the detection of the forward voltage and the forward current of the freewheel diode 42 described above and the characteristic data of the freewheel diode 42, and the calculation of the temperature of the power device 40 using a dynamic thermal model are combined. In this way, the influence of the switching noise is reduced, and the estimation accuracy of the temperature of the power device 40 can be improved.

Figure 5:
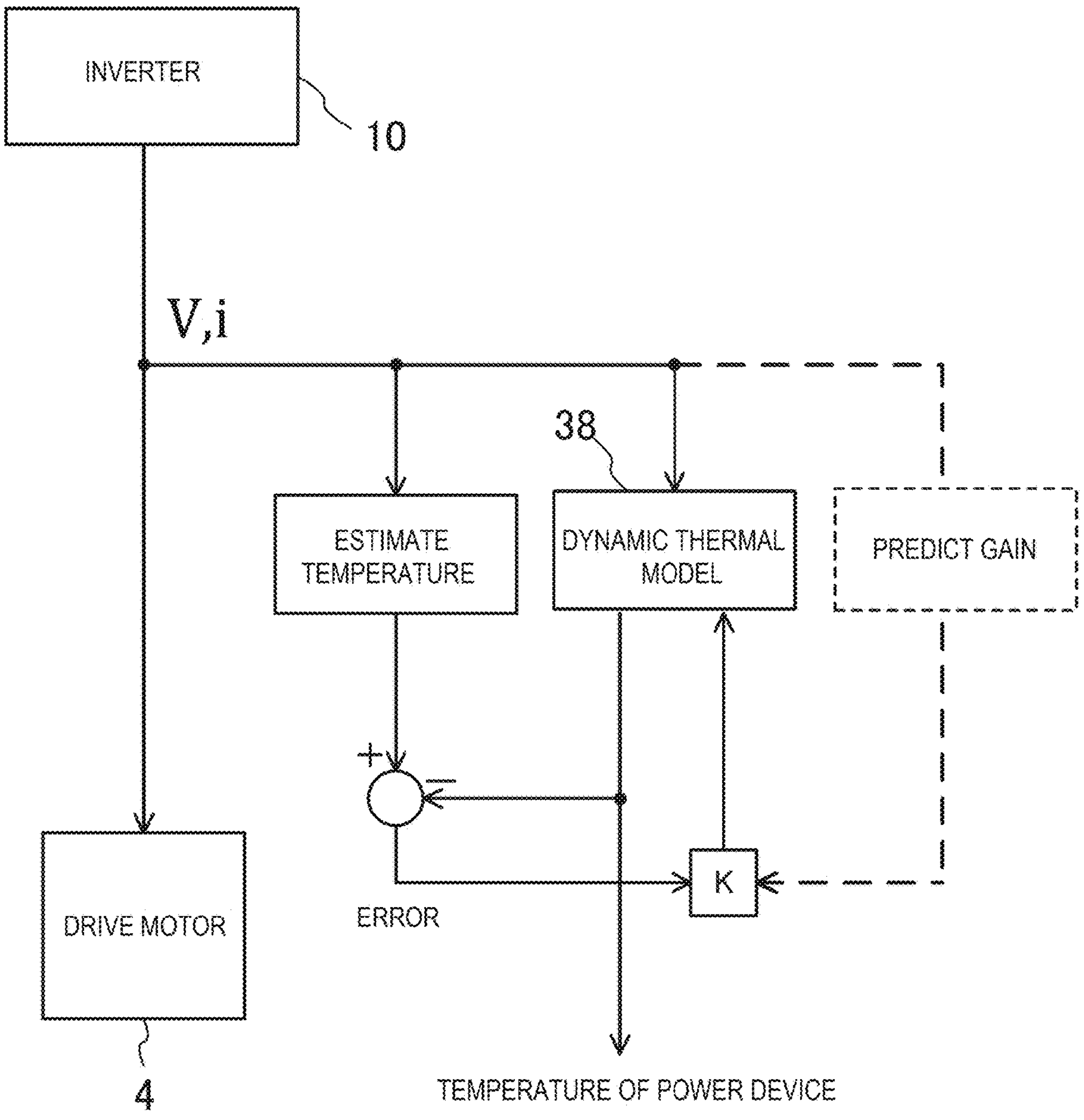
FIG. 5 is a block diagram related to estimation of a temperature of a power device.

FIG. 5 is a block diagram related to the estimation of the temperature of the power device 40. The diode temperature estimation section 34 further includes a dynamic thermal model 38. In addition, the diode temperature estimation section 34 has extended software to estimate the temperature of the freewheel diode 42 by combining the dynamic thermal model 38 and the estimation of the temperature of the power device 40 described above. This extended software is based on the known Kalman filter.

The dynamic thermal model 38 can be designed by using known thermo-fluid analysis software or the like on the basis of surrounding structures of the power device 40, such as the board 20*a* and the heat dissipator 20*b*, and the respective factors, such as the current and the voltage output from the inverter 10, that contribute to the temperature change in the power device 40.

During the actuation of the inverter 10, the current and the voltage are constantly output to the drive motor 2. At the same time, the refrigerant is circulated through the heat dissipator 20*b*. In the dynamic thermal model 38, the temperature of the power device 40 is dynamically calculated by detecting and introducing each of the above factors that affect both of heat generation and heat dissipation of the power device 40.

The dynamic thermal model 38 can be stored as a calculation program in the memory of the AD converter 35. Furthermore, a heat generation map and a heat dissipation map may be stored in the memory of the AD converter 35 and may appropriately be referred. The heat generation map is set on the basis of a relationship between the heat generation amount of the power device 40 and each of the current and the voltage output from the inverter 10. The heat dissipation map is set on the basis of a relationship between a heat dissipation amount of the power device 40 and each of a flow rate and a temperature of the refrigerant.

The diode temperature estimation section 34 identifies the current and the voltage (the electric power), which are output from the inverter 10, from command values, actually measured values thereof, and the like. At the same time, the diode temperature estimation section 34 also identifies the flow rate and the temperature of the refrigerant, which is supplied to the heat dissipator 20*b*, from command values, actually measured values thereof, and the like. Then, each of these factors that affect both of the heat generation and the heat dissipation by the power device 40 is introduced into the dynamic thermal model 38. In this way, the temperature of the power device 40 is sequentially calculated.

The diode temperature estimation section 34 uses the known Kalman filter to calculate an error between the temperature of the power device 40 calculated using the dynamic thermal model 38 (the calculated element temperature) and the estimated element temperature and also calculate an optimal gain K (Kalman gain K) that minimizes the error. Then, the diode temperature estimation section 34 introduces the calculated error and the Kalman gain K into the dynamic thermal model 38 to modify modification items related to the noise in the dynamic thermal model 38. In this way, the diode temperature estimation section 34 modifies the dynamic thermal model 38. Thereafter, the calculated value that is acquired by the modified dynamic thermal model 38 is adopted as the temperature of the power device 40.

As a result, the dynamic thermal model 38 is successively modified, and the calculated element temperature converges to a true value. Thus, the diode temperature estimation section 34 can estimate the temperature of the power device 40 with the reduced switching noise. As a result, the estimation accuracy of the temperature of the power device 40 is improved.

Since the dynamic thermal model 38 is not affected by switching, the calculated element temperature does not include the switching noise. In contrast, as described above, the actually-measured estimated element temperature includes the switching noise. Accordingly, the error between the calculated element temperature and estimated element temperature includes a model error caused by the dynamic thermal model 38 and the noise error caused by the switching noise.

In this case, the Kalman filter minimizes the model error while minimizing the noise error. More specifically, covariance of these errors is calculated, and the gain K that minimizes the covariance value is taken as the optimal gain K, that is, Kalman gain K.

In this case, however, the calculation of the covariance is computationally burdensome. This may cause a delay in responsiveness. The hardware may excessively be increased in size, which prevents incorporation into the AD converter 35.

For the above reason, it may be configured to predict a change in the switching noise in advance and change the gain K accordingly (so-called feed-forward control). In this way, the calculation of the Kalman gain K is no longer necessary, which reduces the calculation load and achieves the high responsiveness while improving the estimation accuracy of the temperature of the power device 40.

(Combination of Feed-Forward Control)

More specifically, as indicated by a broken line in FIG. 5, the appropriate gain K is predicted on the basis of the current and the voltage output from the inverter 10, so as to change a magnitude of the gain K.

The diode temperature estimation section 34 further includes predetermined gain setting data. The extended software described above is then configured to use this gain setting data. The gain setting data includes data on a correlation between the noise of the inverter 10, that is, specific output associated with the switching noise and the gain K corresponding to the dynamic thermal model 38 (also referred to as a predictive gain K to be distinguished from the Kalman gain K).

For example, the switching noise is increased as the current output from the inverter 10 is increased. The switching noise is reduced as the current output from the inverter 10 is reduced. Thus, the current value that is output by the inverter 10 is correlated with the change in the switching noise (corresponding to the specific output).

Figure 6:
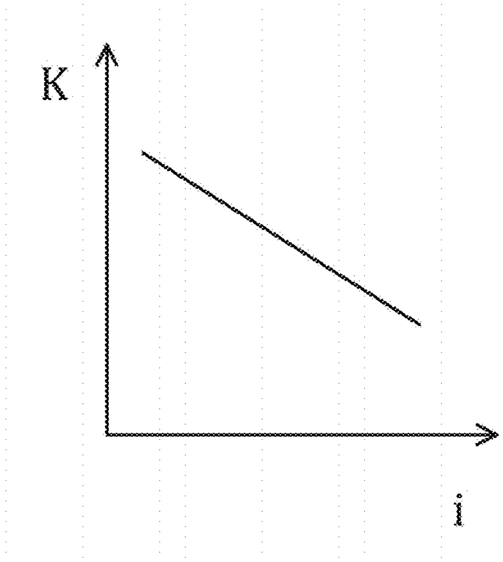
FIG. 6 is a conceptual graph of first gain setting data.

The diode temperature estimation section 34 includes the gain setting data (first gain setting data) on a correlation between a current value i output from the inverter 10 and the predictive gain K, as illustrated in FIG. 6. The first gain setting data is set such that the predictive gain K is reduced as the current value i output from the inverter 10 is increased.

In addition, the switching noise is increased as a carrier frequency of the inverter 10 is reduced. The switching noise is reduced as the carrier frequency of the inverter 10 is increased. Thus, the carrier frequency of the inverter 10 is correlated with the change in the switching noise (corresponding to the specific output).

Figure 7:
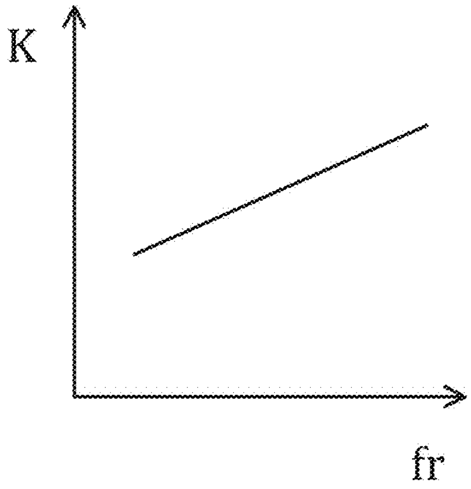
FIG. 7 is a conceptual graph of second gain setting data.

The diode temperature estimation section 34 includes the gain setting data (second gain setting data) on a correlation between a carrier frequency fr of the inverter 10 and the predictive gain K, as illustrated in FIG. 7. The second gain setting data is set such that the predictive gain K is reduced as the carrier frequency fr of the inverter 10 is reduced.

The diode temperature estimation section 34 may also include the gain setting data (third gain setting data) on a correlation between the predictive gain K and each of the current value output from the inverter 10 and the carrier frequency of the inverter 10. This increases an amount of the data. However, the predictive gain K that corresponds to the changes in both of these specific outputs can be acquired.

The diode temperature estimation section 34 predicts the appropriate gain K on the basis of the current value and the carrier frequency output from the inverter 10 and either one of the first gain setting data and the second gain setting data (or third gain setting data), and acquires the predictive gain K.

For example, when the current value that is output from the inverter 10 is input, the diode temperature estimation section 34 acquires the predictive gain K that corresponds to the current value from the first gain setting data. Accordingly, when the current value that is output from the inverter 10 is reduced, the predictive gain K is increased accordingly. When the current value that is output from the inverter 10 is increased, the predictive gain K is reduced accordingly.

Similarly, when the carrier frequency of the inverter 10 is input, the diode temperature estimation section 34 acquires the predictive gain K that corresponds to the carrier frequency from the second gain setting data. Accordingly, when the carrier frequency of the inverter 10 is increased, the predictive gain K is increased accordingly. When the carrier frequency of the inverter 10 is reduced, the predictive gain K is reduced accordingly.

The diode temperature estimation section 34 introduces the thus-acquired predictive gain K and the error between the estimated element temperature and the calculated element temperature into the dynamic thermal model 38, and modifies the modification items associated with the noise in the dynamic thermal model 38. In this way, the diode temperature estimation section 34 modifies the dynamic thermal model 38. Thereafter, the calculated value that is acquired by the modified dynamic thermal model 38 is adopted as the temperature of the power device 40.

As a result, the dynamic thermal model 38 is successively modified, and the calculated element temperature converges to the true value. Thus, the diode temperature estimation section 34 can estimate the temperature of the power device 40 with the reduced switching noise. As a result, the estimation accuracy of the temperature of the power device 40 is improved. In addition, since the calculation of the Kalman gain K is no longer necessary, the calculation load can be reduced, and the high responsiveness can be ensured. As a result, the hardware can be downsized and can easily be integrated into the AD converter 35.

<Specific Example of Temperature Management for Power Device 40 by Temperature Estimation Device 30>

Figure 8:
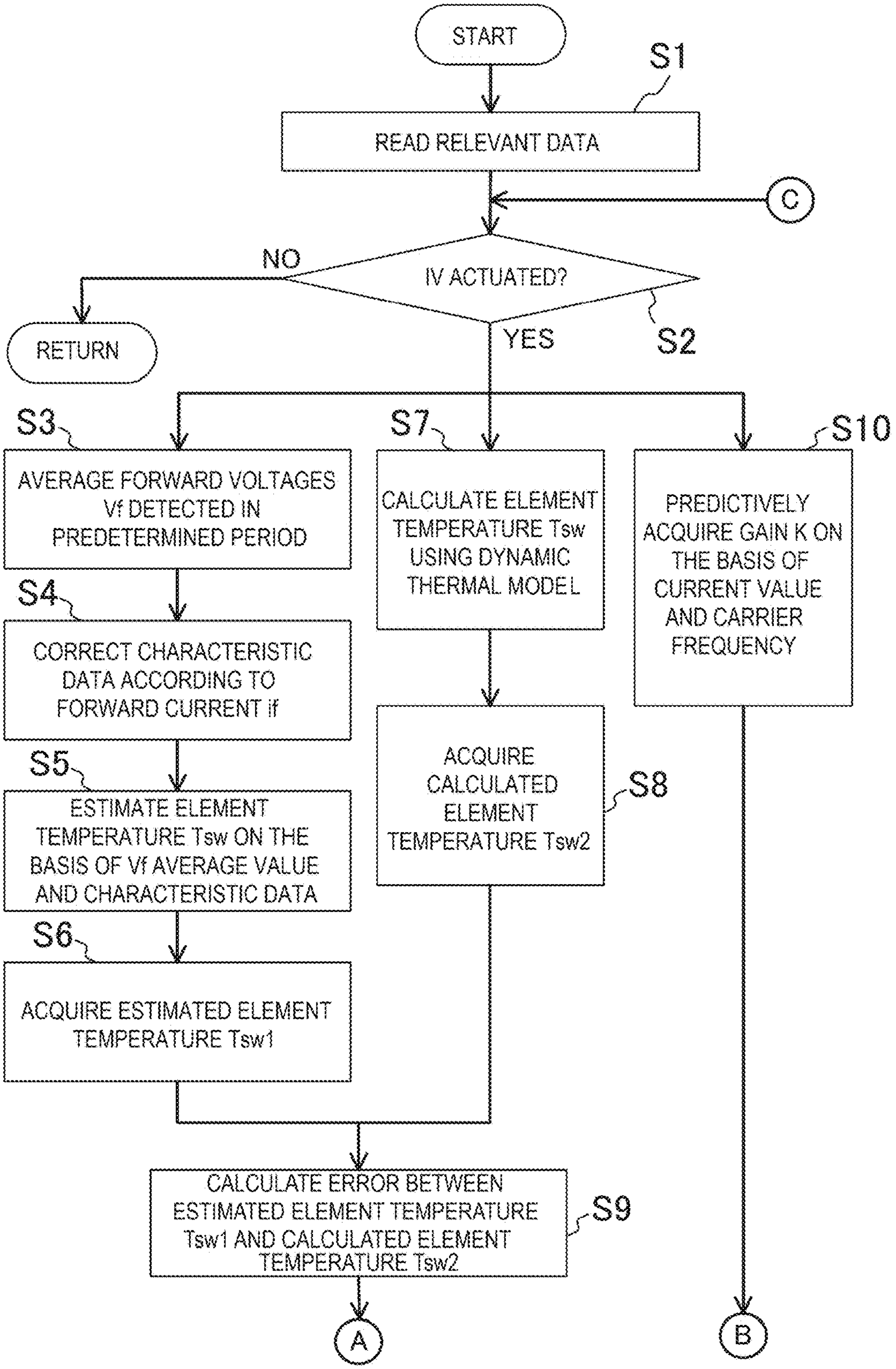
FIG. 8 is a flowchart related to temperature management control for the power device.
Figure 9:
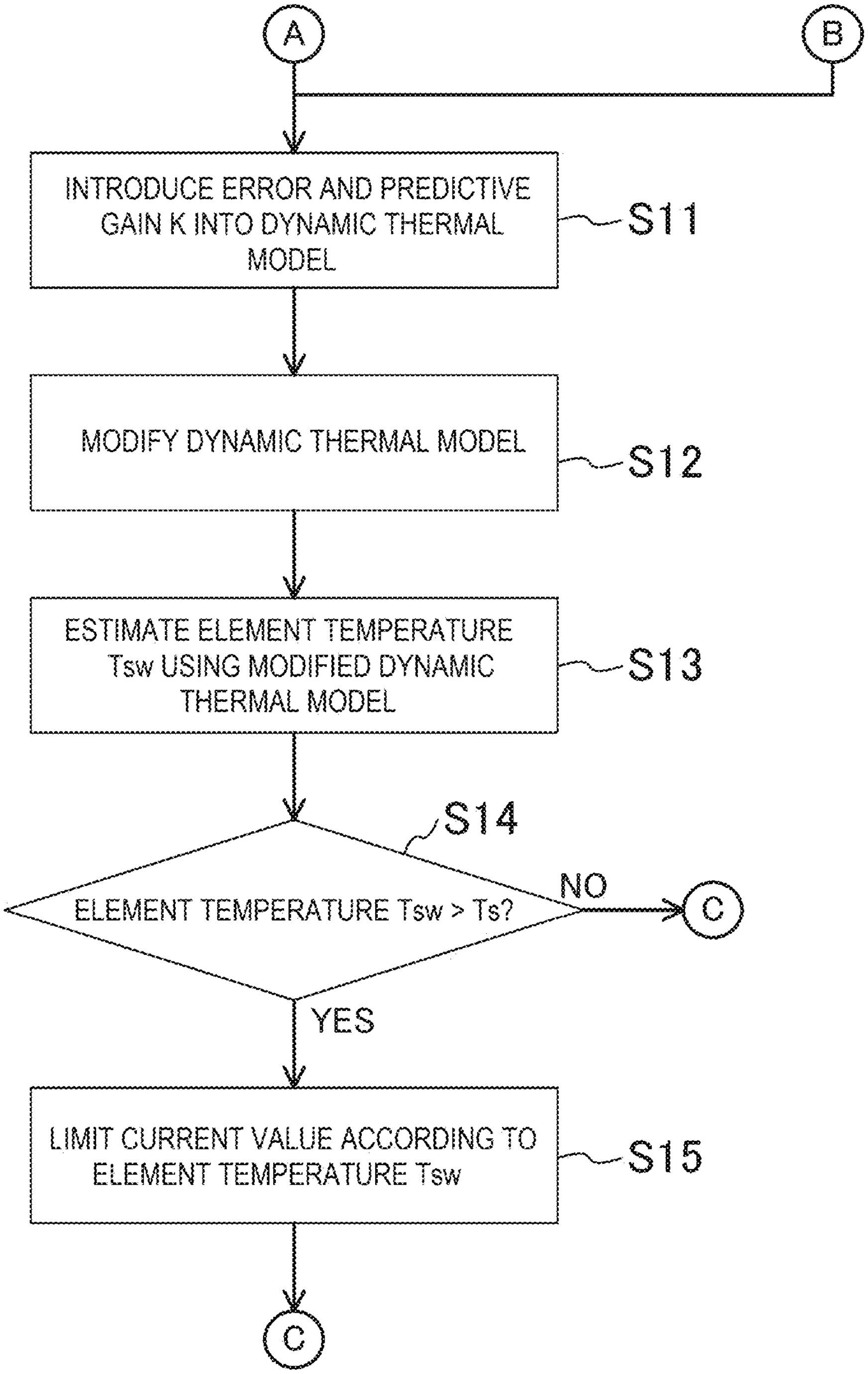
FIG. 9 is a flowchart following FIG. 8.

FIG. 8 and FIG. 9 illustrate an example of temperature management control for the power device 40, for which the countermeasure against the noise is taken, by the temperature estimation device 30. This temperature estimation device 30 takes the countermeasure against the noise by the combination of the feed-forward control described above.

When the electric vehicle 1 is keyed in and the electric power is applied to the onboard electrical equipment, the temperature estimation device 30 starts reading the relevant data such as the current output from the inverter 10 (step S1). The temperature estimation device 30 always executes processing in the temperature management control while the inverter 10 is actuated, that is, while the electric power is applied to the onboard electrical equipment (Yes in step S2). The temperature estimation device 30 stops the processing in the temperature management control when the inverter 10 is stopped (No in step S2).

When the inverter 10 is actuated and outputs the electric power to the drive motor 2, the temperature estimation device 30 (the diode temperature estimation section 34) preferably executes temperature estimation processing for the power device 40, which is based on the temperature of the freewheel diode 42, temperature calculation processing for the power device 40 using the dynamic thermal model 38, and acquisition processing of the predictive gain K in parallel. This enables the temperature estimation in a short time and thus ensures superior responsiveness.

(Temperature Estimation Processing for Power Device 40 Based on Temperature of Freewheel Diode 42)

In the temperature estimation processing for the power device 40, which is based on the temperature of the freewheel diode 42, the temperature estimation device 30 first executes processing to average the forward voltage Vf detected in a predetermined period (step S3). More specifically, the temperature estimation device 30 averages a plurality of values of the voltage that are detected within a predetermined electrical angle range, which is set in advance. The thus-acquired value (a VF average value) is used to estimate the temperature of the freewheel diode 42.

Figure 10:
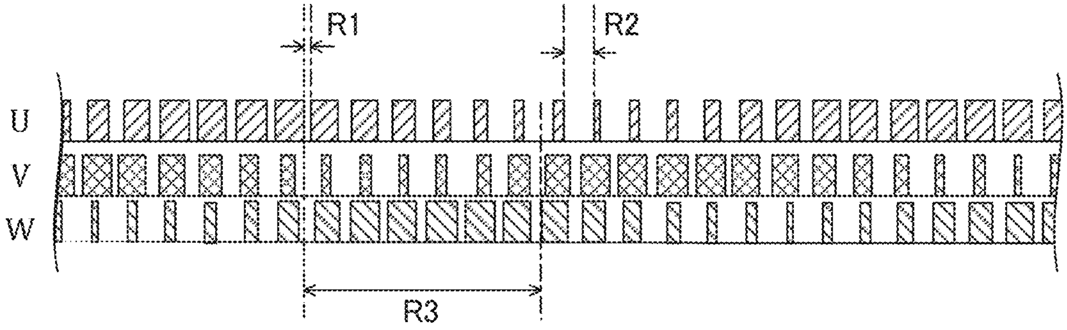
FIG. 10 is schematic view illustrating a timing chart related to on/off of each of the power devices.

FIG. 10 illustrates a timing chart related to on/off of each of the power devices 40 that are arranged in the lower arms 13*a* of the U, V, and W-phases. Each of hatched portions represents an on period, and a portion between two each of the hatched portions represents the off period. As illustrated in FIG. 2, this temperature estimation device 30 sets the power device 40 of the U-phase as the estimation target. Thus, the forward voltage Vf in the off period (R1 or R2) thereof is detected.

As described above, the detection of the forward voltage Vf is more significantly affected by the switching noise as the off period is shortened. Accordingly, the influence of the switching noise can be reduced when the forward voltage Vf is detected in the long off period (for example, R2). However, when the forward voltage Vf is only detected in the long off period, the detection timing is significantly limited, which prevents the appropriate estimation of the temperature of the power device 40.

In contrast, in the case of this temperature estimation device 30, the influence of the noise can be suppressed by the countermeasure against the noise described above. Thus, the forward voltage Vf can be detected regardless of duration of the off period. For example, the forward voltage Vf can be detected even in the shortest off period R1.

In view of the above, in this temperature estimation device 30, a predetermined period, such as the electrical angle 120° (a period R3), is set in advance, the forward voltage Vf is detected in each of the consecutive off periods within the range, and these forward voltages Vf are averaged. As a result, the stable forward voltage Vf can be acquired.

The number of the forward voltages Vf that can be detected at the predetermined electrical angle depends on the carrier frequency. As the carrier frequency is increased, the number of the forward voltages Vf that can be detected is increased. As described above, the switching noise is reduced as the carrier frequency is increased. Thus, the further stable forward voltage Vf can be acquired.

The temperature estimation device 30 corrects the characteristic data according to the detected forward current if (step S4). That is, as illustrated in FIG. 4, the correction value a is identified from the detected forward current if and the current correction data, and the voltage-temperature characteristic data is corrected to the data that corresponds to the forward current if by using the correction value a.

Then, the temperature estimation device 30 estimates an element temperature Tsw on the basis of the acquired Vf average value and the corrected voltage-temperature characteristic data (step S5). The temperature estimation device 30 acquires the thus-estimated element temperature Tsw as an estimated element temperature Tsw1 (step S6).

(Temperature Calculation Processing for Power Device 40 Using Dynamic Thermal Model 38)

In the temperature calculation processing for the power device 40 using the dynamic thermal model 38, the temperature estimation device 30 calculates the element temperature Tsw by using the dynamic thermal model 38 (step S7). More specifically, the temperature estimation device 30 identifies the current and the voltage (the electric power), which are output from the inverter 10, from the command values, the actually measured values thereof, and the like. At the same time, the temperature estimation device 30 also identifies the flow rate and the temperature of the refrigerant, which is supplied to the heat dissipator 20*b*, from the command values, the actually measured values thereof, and the like. Then, each of these factors that affect both of the heat generation and the heat dissipation by the power device 40 is introduced into the dynamic thermal model 38. In this way, the temperature estimation device 30 calculates the temperature of the power device 40.

The temperature estimation device 30 acquires the thus-estimated element temperature Tsw as a calculated element temperature Tsw2 (step S8).

The temperature estimation device 30 subjects the acquired estimated element temperature Tsw1 and calculated element temperature Tsw2 to subtraction processing, and thereby calculate errors thereof (step S9). Since only the subtraction is required, there is almost no calculation load.

(Acquisition Processing of Predictive Gain K)

The temperature estimation device 30 predictively acquires the gain K from the current and the voltage (the electric power) output from the inverter 10 on the basis of the specific outputs (the current value and the carrier frequency) associated with the noise (step S10).

More specifically, when the current value that is output from the inverter 10 is input, the diode temperature estimation section 34 acquires the predictive gain K that corresponds to the current value from the first gain setting data. In addition, when the carrier frequency of the inverter 10 is input, the diode temperature estimation section 34 acquires the predictive gain K that corresponds to the carrier frequency from the second gain setting data. The temperature estimation device 30 preferentially employs the predictive gain K that is based on either the current value or the carrier frequency, depending on the situation.

In the case where the diode temperature estimation section 34 includes the third gain setting data, and the current value and the carrier frequency output from the inverter 10 are input, the diode temperature estimation section 34 acquires the predictive gain K that corresponds to the current value and the carrier frequency from the third gain setting data.

After the calculation processing of the error between the estimated element temperature Tsw1 and the calculated element temperature Tsw2 and the acquisition processing of the predictive gain K are completed, as illustrated in FIG. 9, the temperature estimation device 30 introduces the calculated error and the acquired predictive gain K into the dynamic thermal model 38 (step S11).

Then, as described above, the temperature estimation device 30 modifies the dynamic thermal model 38 and estimates the element temperature Tsw by using the modified dynamic thermal model 38 (steps S12 and S13).

More specifically, the predictive gain K and the error are used to modify the modification items associated with the noise of the dynamic thermal model 38. In this way, the dynamic thermal model 38 is modified. Thereafter, the calculated value that is acquired by the modified dynamic thermal model 38 is adopted as the final estimated element temperature Tsw of the power device 40.

Figure 11:
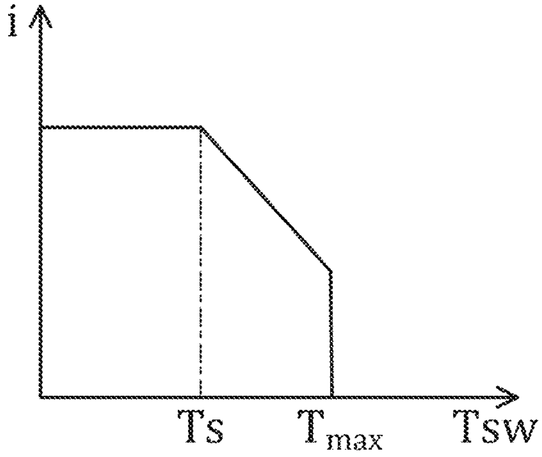
FIG. 11 is a conceptual view of current limit data.

The temperature estimation device 30 determines whether the thus-estimated element temperature Tsw exceeds the predetermined temperature Ts (step S14). More specifically, the temperature estimation device 30 (the diode temperature estimation section 34) has preset data (current limit data) indicating a relationship between a maximum current value, which can be output from the inverter 10, and the element temperature Tsw, as illustrated in FIG. 11.

Then, the temperature estimation device 30 refers to the current limit data. If the estimated element temperature Tsw exceeds the temperature Ts (Yes in step S14), the temperature estimation device 30 reduces the maximum current value, which can be output from the inverter 10 according to the element temperature Tsw, and manages the current so as not to exceed such a value (step S15).

In the case where the estimated element temperature Tsw is equal to or higher than Tmax, the actuation of the inverter 10 is stopped to prevent output of the current therefrom. On the other hand, the temperature estimation device 30 refers to the current limit data, and, if the estimated element temperature Tsw does not exceed the temperature Ts (No in step S14), sets the maximum current value as usual (a constant value), and manages the current so as not to exceed such a value. Then, the processing returns to step S2, and the estimation processing of the element temperature Tsw is repeated.

Just as described, this temperature estimation device 30 can estimate the temperature of the switching element 41 with the high degree of accuracy even when the switching element 41 is provided in the inverter 10 using the high voltage. Therefore, the thermal damage of the inverter 10 can effectively be prevented by managing the temperature of the switching element 41 with this temperature estimation device 30.

The disclosed technique is not limited to the above-described embodiment and includes various configurations other than that described in the above-described embodiment. For example, in the above-described embodiment, the description has been made on the application example to the electric vehicle 1. However, the disclosed technique can also be applied to a hybrid vehicle.

It should be understood that the embodiments herein are illustrative and not restrictive, since the scope of the invention is defined by the appended claims rather than by the description preceding them, and all changes that fall within metes and bounds of the claims, or equivalence of such metes and bounds thereof, are therefore intended to be embraced by the claims.

DESCRIPTION OF REFERENCE CHARACTERS

1: ELECTRIC CAR
2: DRIVE MOTOR
4: DRIVE BATTERY
10: INVERTER
20: POWER MODULE
20*a*: BOARD
20*b*: HEAT DISSIPATOR
30: POWER DEVICE TEMPERATURE ESTIMATION DEVICE
31: DIODE CURRENT DETECTION SECTION
32: VOLTAGE DIVIDER SECTION
32*a*: VOLTAGE DIVIDER DIODE (FIRST ELEMENT)
32*b*: VOLTAGE DIVIDER RESISTOR (SECOND ELEMENT)
33: DIODE VOLTAGE DETECTION SECTION
33*a*: PROTECTION DIODE
33*b*: TRANSFORMER SECTION
34: DIODE TEMPERATURE ESTIMATION SECTION
35: AD CONVERTER
36: LOAD RESISTOR
38: DYNAMIC THERMAL MODEL
40: POWER DEVICE
41: SWITCHING ELEMENT
42: FREEWHEEL DIODE

The invention claimed is:

1. A power device temperature estimation device that is attached to an inverter and is configured to estimate a temperature of a power device using a temperature of a freewheel diode, the inverter being installed with the power device including a switching element and the freewheel diode connected in anti-parallel with the switching element, the power device temperature estimation device comprising:

a voltage divider section having a voltage divider circuit that includes a first element and a second element connected in series with each other and is connected in parallel with the freewheel diode;

a diode voltage detection section that is connected in parallel with the second element to detect a forward voltage of the freewheel diode on the basis of a divided voltage of the second element;

a diode current detection section that is configured to detect a forward current of the freewheel diode; and a diode temperature estimation section that has characteristic data on a voltage, a current, and a temperature of the freewheel diode and is configured to estimate the temperature of the freewheel diode on the basis of the detected forward voltage, the detected forward current, and the characteristic data, wherein the first element is a diode arranged in forward parallel with the freewheel diode, and the second element is a resistor.

2. The power device temperature estimation device according to claim 1, wherein the diode voltage detection section includes a transformer section that increases the divided voltage of the second element.

3. The power device temperature estimation device according to claim 1, wherein the diode voltage detection section includes a protection diode that is connected in parallel with the second element.

4. The power device temperature estimation device according to claim 3, wherein the inverter is further installed with:

a board on which the power device is installed; and a heat dissipator attached to the board, and the first element is separately arranged from the board or is arranged on the board in a contact state with the heat dissipator, and a temperature of the first element is thereby maintained within an allowable range for detection of the forward voltage.

5. The power device temperature estimation device according to claim 1, wherein the diode temperature estimation section further includes a dynamic thermal model to calculate the temperature of the power device, and the diode temperature estimation section is further configured to:

calculate an error between an estimated element temperature, which is the temperature of the power device estimated by the diode temperature estimation section, and a calculated element temperature, which is the temperature of the power device calculated using the dynamic thermal model, and calculate a Kalman gain;

modify the dynamic thermal model by introducing the error and the Kalman gain; and adopt a calculated value using the modified dynamic thermal model as the temperature of the power device.

6. The power device temperature estimation device according to claim 1, wherein the diode temperature estimation section further includes:

a dynamic thermal model to calculate the temperature of the power device; and gain setting data on a specific output associated with noise of the inverter and a gain corresponding to the dynamic thermal model, and the diode temperature estimation section is further configured to:

calculate an error between an estimated element temperature, which is the temperature of the power device estimated by the diode temperature estimation section, and a calculated element temperature, which is the temperature of the power device calculated by the dynamic thermal model;

acquire the gain from the gain setting data;

modify the dynamic thermal model by introducing the error and the gain; and adopt a calculated value using the modified dynamic thermal model as the temperature of the power device.

7. The power device temperature estimation device according to claim 6, wherein the specific output is a current value output from the inverter and is set in the gain setting data such that the gain is reduced as the current value is increased.

8. The power device temperature estimation device according to claim 6, wherein the specific output is a carrier frequency of the inverter and is set in the gain setting data such that the gain is reduced as the carrier frequency is reduced.

9. The power device temperature estimation device according to claim 8, wherein the forward voltage of the freewheel diode is detected in an off period of the switching element, and is detected regardless of duration of the period.

10. The power device temperature estimation device according to claim 9, wherein a value that is acquired by averaging a plurality of values of the forward voltage is used to estimate the temperature of the freewheel diode, the plurality of values being detected within a predetermined electrical angle range, which is set in advance.

11. The power device temperature estimation device according to claim 1, wherein the inverter is further installed with:

a board on which the power device is installed; and a heat dissipator attached to the board, and the first element is separately arranged from the board or is arranged on the board in a contact state with the heat dissipator, and a temperature of the first element is thereby maintained within an allowable range for detection of the forward voltage.

12. The power device temperature estimation device according to claim 2, wherein the inverter is further installed with:

a board on which the power device is installed; and a heat dissipator attached to the board, and the first element is separately arranged from the board or is arranged on the board in a contact state with the heat dissipator, and a temperature of the first element is thereby maintained within an allowable range for detection of the forward voltage.

13. The power device temperature estimation device according to claim 5, wherein the forward voltage of the freewheel diode is detected in an off period of the switching element, and is detected regardless of duration of the period.

14. The power device temperature estimation device according to claim 6, wherein the forward voltage of the freewheel diode is detected in an off period of the switching element, and is detected regardless of duration of the period.

15. The power device temperature estimation device according to claim 7, wherein the forward voltage of the freewheel diode is detected in an off period of the switching element, and is detected regardless of duration of the period.

16. The power device temperature estimation device according to claim 13, wherein a value that is acquired by averaging a plurality of values of the forward voltage is used to estimate the temperature of the freewheel diode, the plurality of values being detected within a predetermined electrical angle range, which is set in advance.

17. The power device temperature estimation device according to claim 14, wherein a value that is acquired by averaging a plurality of values of the forward voltage is used to estimate the temperature of the freewheel diode, the plurality of values being detected within a predetermined electrical angle range, which is set in advance.

18. The power device temperature estimation device according to claim 15, wherein a value that is acquired by averaging a plurality of values of the forward voltage is used to estimate the temperature of the freewheel diode, the plurality of values being detected within a predetermined electrical angle range, which is set in advance.

* * * * *